United States Patent [19]

Schreiber

[11] Patent Number: 4,581,588

[45] Date of Patent: * Apr. 8, 1986

[54] SWITCHABLE BANDPASS FILTER

[75] Inventor: Paul T. Schreiber, Fort Worth, Tex.

[73] Assignee: Tandy Corporation, Fort Worth, Tex.

[*] Notice: The portion of the term of this patent subsequent to Mar. 13, 2001 has been disclaimed.

[21] Appl. No.: 578,270

[22] Filed: Feb. 8, 1984

Related U.S. Application Data

[63] Continuation of Ser. No. 335,553, Dec. 29, 1981, Pat. No. 4,436,956.

[51] Int. Cl.⁴ .............................................. H03F 1/91
[52] U.S. Cl. .................................... 330/107; 330/302
[58] Field of Search .............. 330/107, 109, 294, 306, 330/302; 179/2 C

[56] References Cited

U.S. PATENT DOCUMENTS 3,978,422  8/1976  Rheinfelder ..................... 330/306

Primary Examiner—James B. Mullins
Assistant Examiner—G. Wan
Attorney, Agent, or Firm—Wolf, Greenfield & Sacks

[57] ABSTRACT

A bandpass filter suitable for use in modem circuitry and other applications which require the filter's center frequency to be switched is disclosed. The filter circuit has the characteristic that although the center frequency is changed the overall gain of the filter remains constant. This characteristic results from using a plurality of filter sections which each have low individual gain and providing compensating gain at the input of the filter. In addition, compensating gain elements are used in each filter section so that when the center frequency of the filter is changed, the gain of each filter stage remains constant.

16 Claims, 3 Drawing Figures

SWITCHABLE BANDPASS FILTER

This application is a continuation of application Ser. No. 335,553, filed 12-29-81, now U.S. Pat. No. 4,436,956.

FIELD OF THE INVENTION

This invention relates to electronic filter circuits and, in particular, to active electronic filter circuits.

BACKGROUND OF THE INVENTION

In many applications involving the processing of electronic signals it is desirable to initially filter the signals to remove unwanted frequencies and spurious noise and to select a small, predetermined frequency range for further processing. Such a filtering operation is typically performed with a bandpass filter.

Many prior filter circuits have been designed in an attempt to produce a filter circuit which has dual characteristics of a high amount of signal attenuation for signals with frequencies outside the predetermined frequency range (designated as the "passband") and a low amount of signal attenuation for signals having frequencies inside the passband.

The filtering problem is further complicated because many electronic circuits process signals which have frequencies in several distinct ranges. One such electronic circuit is a modem, a device that allows electronic computers to communicate via ordinary telephone lines. The modem converts electronic digital signals produced by one computer into audio-frequency signals which are then transmitted over a telephone line. A corresponding modem at the other end of the telephone line receives the audio-frequency signals and reconverts them into digital signals which are then used by another computer.

In a typical prior art modem communication system, two different sets (four frequencies total) are used to provide full duplex operation. The audio-frequencies generated and received by each modem may be selected from either set depending on whether the modem originated the telephone connection or merely answered a telephone call placed by another modem. Typically, a modem must be able to receive a small band of audio-frequencies with an approximate center frequency or 1170 Hertz if it is in the "answer" mode and a center frequency of 2100 Hertz if it is in the "originating" mode. The width of the passband is typically 400 Hertz in both cases.

In order to filter signals in two separate ranges with widely spaced center frequencies, it is necessary to design two bandpass filters with substantially different characteristics. Therefore, a typical prior art solution to this problem has been to use two separate filter circuits which have many duplicated components. This solution, although straightforward, is not totally satisfactory when applied to a modem in which only one filter circuit is in use at any given time (depending on whether the modem is in the "answer" or "originate" mode). Obviously this prior art approach results in duplication of components and increased costs.

To avoid duplication of parts, other prior art attempts have been made to design a single bandpass filter having two separate passbands by utilizing an active filter circuit with multiple feedback loops and interchanging components in the filter networks to change the center frequency of the filter. These attempts have encountered problems, however, because the signal gain of such a switchable filter usually changes when the values of the components in the filter networks are changed.

It is therefore an object of the invention to provide a switchable bandpass filter having passbands with two separate center frequencies which utilizes a minimum number of components.

It is a further object of the invention to provide a switchable bandpass filter in which the overall signal gain remains constant even though the center frequency changes.

It is a still further object of the invention to produce increased sensitivity and selectivity of the bandpass filter circuitry.

SUMMARY OF THE INVENTION

The foregoing problems are solved and the foregoing objects are achieved in one illustrative embodiment of the invention in which a multi-section active filter circuit having switchable passive components is provided in which the gain of each of the filter section is low. Overall filter gain is achieved by a separate amplifier at the filter input. In order to change the center frequency of the filter, passive components in each filter stage are changed and gain compensation elements in each stage are changed simultaneously so that the gain of each filter stage remains constant even though the center frequency has changed.

More particularly, a six-pole Chebyshev filter is provided which uses three active filter sections incorporating operational amplifiers. The active sections are provided with sets of passive frequency-selection components which can be interchanged by means of electronic switches in order to change the center frequency of the filter. The components are chosen so that the gain of each section is low compared to the gain of prior art filter sections, and a separate amplifier is provided at the input of the first section to provide gain for the overall filter. In order to compensate for changes in signal level when the center frequency of the filter is changed, the feedback circuits of the operational amplifiers are also modified by means of electronic switches so that the signal gain of each filter stage remains relatively constant.

DETAILED DESCRIPTION

Figure 1:
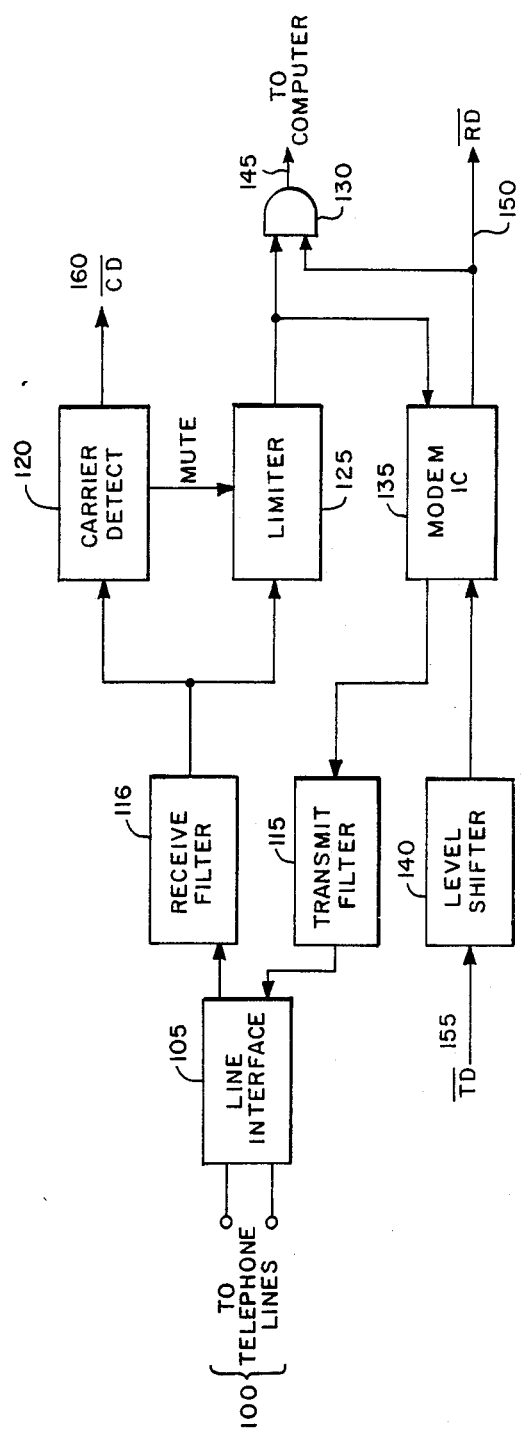
FIG. 1 shows a block diagram of an electronic modem utilizing the inventive switchable bandpass filter.

Referring to FIG. 1, modem circuitry containing the illustrative switchable bandpass filter is shown in block schematic form. The modem is connected to telephone line 100 via line interface 105, which contains "matching" circuitry that helps match the internal impedance of the modem circuitry to the impedance of the telephone line to prevent echoes and noise.

Digital information is passed between modems by means of audio-frequency signals in which information has been encoded by frequency-shift keying (FSK) techniques that are well-known. Specifically, in a typical FSK arrangement, if a modem is operating in the "answer" mode, it encodes an FSK "mark" (corresponding to a digital "1") as an audio signal with a frequency of 1270 Hertz. An FSK "space" (corresponding to a digital "0") is encoded as a signal with a frequency of 1070 Hertz. On the other hand, if the modem is operating in the "originate" mode a "mark" is encoded by a signal with a frequency of 2225 Hertz and a "space" is encoded by a signal with a frequency of 1025 Hertz.

Incoming information from interface 105 is provided to receive filter 116 which illustratively incorporates principles of the invention. Receive filter 116 is a bandpass filter which has a center frequency of approximately 2100 Hertz when the modem is operating in the "originate" mode and a center frequency of 1170 Hertz when the modem is operating in the "answer" mode. The bandwidth of the filter in both cases is approximately 400 Hertz. The narrow passband and widely-separated center frequencies insure that only signals which are within the FSK bandwidth are processed by the system and that outgoing signals produced by the modem itself do not interfere with incoming signals from other modems.

The output of receive filter 116 is a sinusoidal waveform with a frequency equal to that of the incoming coded signals. This output is provided to carrier-detect circuit 120 and limiter 125. Carrier-detect circuit 120 detects the presence of a signal having a frequency within the FSK passband and a magnitude greater than a predetermined minimum. Carrier-detect circuit 120 signals the presence of such a signal by generating a signal on carrier-detect line 160. The carrier-detect signal is used to inhibit the modem output when there are no FSK signals present to prevent erroneous noise pulses from being processed by the associated computer system.

Limiter circuit 125 converts the sine wave output of receive filter 116 into a square wave signal which is provided to the output processing circuitry and to modem integrated circuit (I.C.) chip 135. I.C. chip 135 is a prior art integrated circuit which decodes the FSK-encoded data in a well-known manner to produce an output signal on receive data lead 150 indicative of the digital information encoded in the FSK signals.

Certain computer circuitry can accept the digital signals produced by chip 135 and, accordingly, the information on lead 150 may by provided directly to the associated computer circuitry for further processing. Other computer circuits only receive data from the modem via an "audio cassette port". This port can receive data encoded by audio signals, but only in a format different from the FSK signal format. When the modem operates with the latter type of computer, the outputs of I.C. chip 135 and limiter 125 are combined by AND gate 130. In the composite output of AND gate 130 a "burst" of audio-frequency signals represents a "mark" and the absence of audio-frequency signal represents a "space".

Data which is to be transmitted on telephone line 100 is provided to the modem by a computer or other processing device, via lead 155, to level shifter 140. This data is usually in a standard format known as RS232-C and consists of digital information encoded by means of voltage levels (plus or minus 12 volts). Level shifter 140 converts the data from RS232 voltage levels to voltage levels used by I.C. chip 135 (generally 0 volts to 5 volts).

The information coded into the RS232 voltage levels is converted into FSK format by I.C. chip 135 (which generates a digitally synthesized sine wave of appropriate frequency) and provided to transmit filter 115. Filter 115 removes high-frequency harmonics from the digital sine wave generated by the I.C. chip to prevent feedback of the outgoing signal through receive filter 116. The FSK coded signal is provided to line interface circuit 105 for transmission over telephone line 100 to a remote modem.

Figure 2:
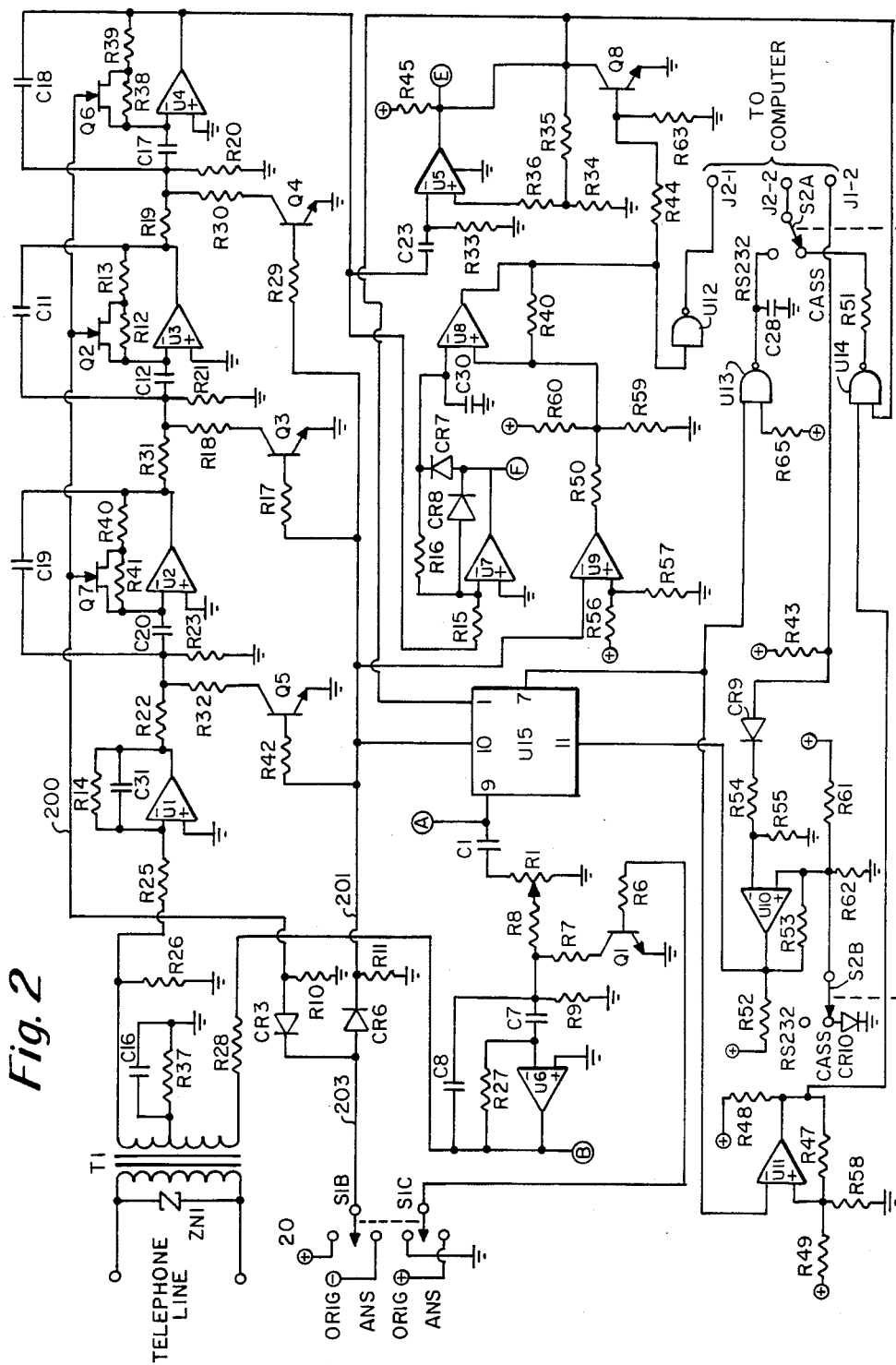
FIG. 2 is a detailed electrical schematic of the modem circuitry shown in the block diagram of FIG. 1.

Referring to FIG. 2, the electrical schematic of the illustrative modem circuitry is shown in detail. Incoming FSK data from a remote modem is provided to the circuitry from the telephone line shown in the upper left hand side of the Figure. The telephone line impedance is matched to the modem input circuit impedance by matching hybrid transformer, T1, which has a tapped secondary winding. A balancing network consisting of resistor R37 and capacitor C16 is connected the center tap of the transformer secondary winding in order to isolate transmitted signals from received signals. In order to reduce noise, the secondary winding is also terminated by resistors R26 and R28. In addition, a 22-volt metal-oxide varistor ZN1 is connected across the primary of the transformer to protect the modem from voltage spikes which may occur on the telephone line.

The FSK tones arriving over the telephone line are coupled by the secondary winding of transformer T1 to the input of amplifier U1 via resistor R25.

In accordance with the invention, amplifier U1 is used to provide gain for the receive filter circuitry. As will be discussed in detail hereinafter each section of the receive filter has been designed to have a signal gain which is much less than the signal gain of prior art units, and amplifier U1 provides most of the gain for the entire filter circuitry. The low gain in each of the filter sections makes its filter characteristics less sensitive to changes in the values of the electronic components which make up each section. Therefore, it is possible to mass produce the filter circuitry with standard components while insuring that the filter circuit will operate properly. Also, in accordance with the principles of this invention, the gain of each section is electronically adjusted during frequency shifts to insure that the overall gian of the filter remains constant. The adjustment may also be done with standard components due to the low gains of each section.

Amplifier U1 is connected in a well-known negative feedback arrangement (wherein resistor R14 provides negative feedback) and also provides some initial pre-filtering, via capacitor C31, to eliminate high-frequency noise generated by the I.C. chip U15. The output of amplifier U1 is provided to the inventive receive filter.

The receive filter utilized by the modem consists of three sections. Each section is "active" in that it includes an amplifier device in addition to various passive components. Devices U2 through U4 and comprise the three sections, and together, devices U2-U4 form a six-pole Chebyshev filter with one dB of ripple in the passband. The filter center frequency is switchable to accomodate the "answer" and "originate" modes of operation by means of transistors Q3-Q5.

Each stage of the circuit has the same basic configuration—only component values are different. Therefore, for the purposes of clarity, the operation of the filter will be described with respect to only one stage. The actual values of the components used in each filter stage can be computed via well-known Chebyshev filter theory and will not be discussed in detail herein.

Each filter section consists of an amplifier, such as amplifier U2 in the first filter section, and associated passive filter elements. Particularly, the first filter section has a feedback loop connected from the output of the amplifier to its negative input consisting of resistors R41 and R40 and capacitor C19 (resistor R41 may be shunted by FET switch Q7). The signal input to the filter stage is provided via resistor R22 which, together with resistor R23 and capacitor C20 acts as a passive filtering stage.

In order to control the center frequency of the first filter section, resistor R23 may be shunted by resistor R32 under control of transistor Q5. Advantageously, according to the invention, when transistor Q5 is operated to change the filter center frequency, FET switch Q7 is also turned off to place resistor R41 in series with resistor R40 maintaining the gain of the first stage constant. FET Q7 and transistor Q5 are, in turn, controlled by signals on lines 200 and 201, respectively. The signals on leads 200 and 201 are controlled by switches which are set depending on the operating mode of the modem.

In particular, lead 200 is connected by diode CR3 to switch S1B. Similarly lead 201 is connected, via diode CR6, to switch S1B. When the modem is in the "originate" mode, switch S1B is in its upward position and connects positive voltage source 205 to the cathode of diode CR3 and the anode of diode CR6, via lead 203. The positive voltage on lead 203 back-biases diode CR3 and forward-biases diode CR6.

Forward-biased diode CR6 places a positive voltage on lead 201 (which is normally held "low" by resistor R11). The positive voltage on lead 201 is supplied, via resistor R42, to the base of transistor Q5, turning it "on". Turned-on transistor Q5 connects the lower terminal of resistor R32 to ground, effectively connecting resistor R32 in parallel with resistor R23 to change the filter center frequency. However, the operation of transistor Q5 also changes the gain of the filter section. Illustratively, FET Q7 is simultaneously operated to maintain the signal gain constant.

Specifically, back-biased diode CR3 allows resistor R10 to maintain a "low" signal on lead 200 which signal, in turn, turns "off" FET Q7 and all other FET's in the receive filter). With FET Q7 "off", resistor R41 and R40 are connected in series, thus increasing the feedback resistance and the gain of the first stage feedback loop.

Similar to filter section U2, filter sections U3 and U4 are provided with switchable feedback networks consisting of FET switches Q2 and Q6, respectively, and transistor switches Q3 and Q4, respectively. Therefore, the characteristics of both of stages U3 and U4 of the illustrative receive filter can be changed in order to change the receive filter center frequency from approximately 2100 Hertz in the "originate" mode to 1170 Hertz in the "answer" mode while maintaining the overall filter gain approximately constant.

Figure 3:
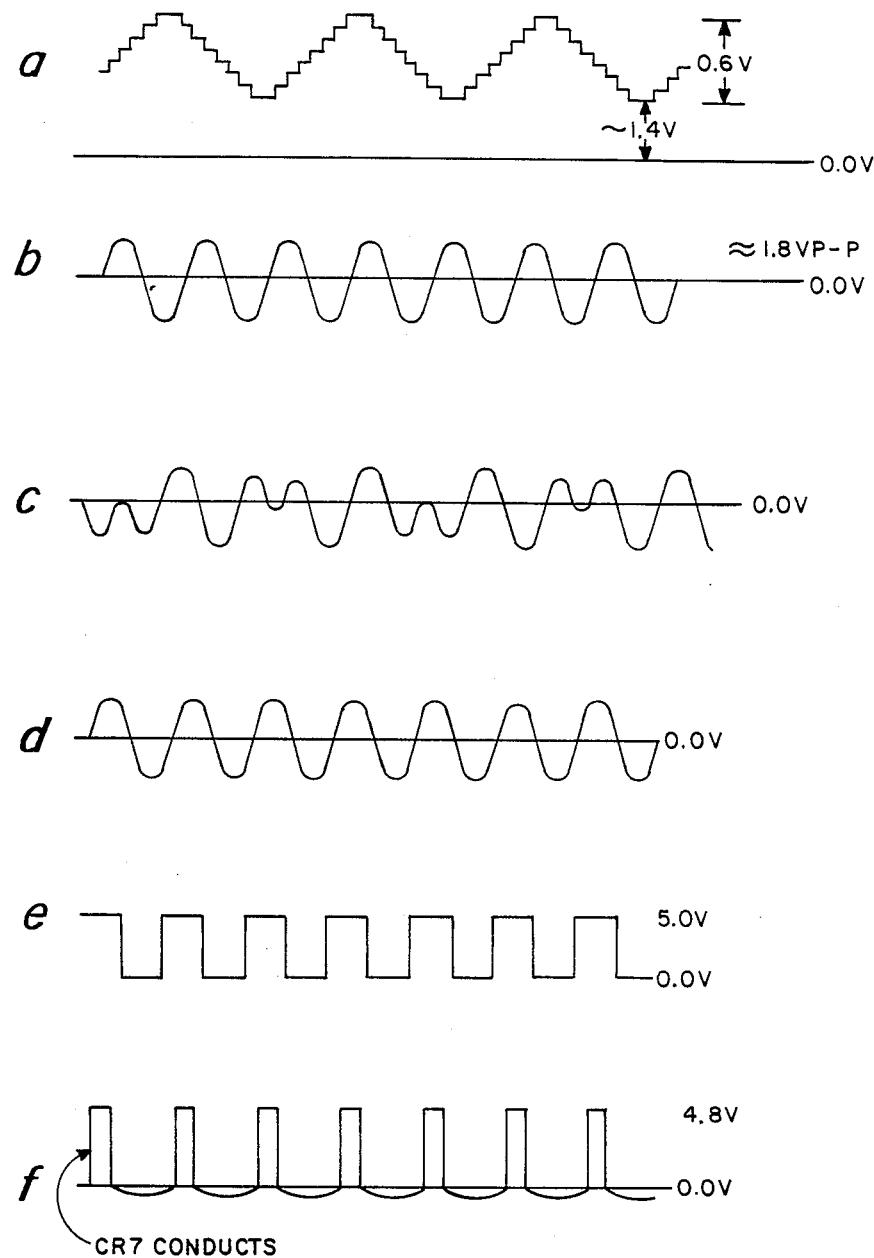
FIG. 3 is a schematic diagram of various electrical waveforms at selected points in the circuit of FIG. 2.

The filtered output signal generated by the receive filter is approximately a sine wave signal as shown in line D of FIG. 3. This signal is provided, via capacitor C23, to limiter circuit U5 and, by resistor R15, to the carrier-detect circuit consisting of devices U7, U8 and U9.

Specifically, the sine wave signal generated at the output of the receive filter is AC-coupled, via capacitor C23, to the inverting input of high-speed comparator U5. Capacitor C23 and resistor R33 are used to remove any DC offset which might be present at the output of the receive filter. The positive input of comparator U5 is connected to ground by resistors R36 and R34 and to the output of the comparator by resistor R35. When connected in this manner the comparator switches its output state when the input signal passes through zero. The output of the comparator is an "open collector" output which is actively pulled "low" by the internal comparator circuitry but is pulled "high" by resistor R45 connected to a positive voltage source. This arrangement allows the output of comparator U5 to be connected with the carrier detect circuit in a "wired-OR" configuration, as will be hereinafter explained.

The limited output produced by device U5 is shown in line E of FIG. 3. This output is provided to the receive input (pin 1) of I.C. chip U15. As will be hereinafter explained, I.C. chip U15 decodes the FSK-coded waveforms to produce DC levels which are provided to the computer.

The output of the receive filter is also provided, via resistor R15, to the carrier-detect circuit consisting of devices U6, U7 and U8. Amplifier U6, in conjunction with diodes CR7 and CR8 comprises an active rectifier circuit. When the signal at resistor R15 becomes negative, the output of amplifier U6 becomes positive, causing diode CR7 to conduct which, in turn, causes the input signal to be amplified and clipped. However, when the voltage at resistor R15 swings positive, diode CR8 conducts and bypasses gain resistor R16, causing the amplifier feedback to be effectively "shorted" producing only a small gain at the amplifier output. The output produced by the halfwave rectifier with a typical signal input from the receive filter is shown at line F in FIG. 3.

The rectified output of amplifier U6 is filtered by capacitor C30 and provided to the inverting input of threshold amplifier U8. The positive input of amplifier U8 is provided with a variable threshold voltage controlled by comparator U9.

The threshold voltage produced by comparator U9 is controlled by the signal level on lead 201. The threshold voltage may be varied depending on whether the modem circuit is operating in the "answer" or "originate" modes. In some embodiments of the invention, the variable threshold may not be necessary. In particular, if precision-trimmed resistors are used in the filter feedback sections, then the gain of the receive filter sections will remain relatively constant when the center frequency changes. However, if standard-value components must be used in the feedback loops of the filter elements, it may not be possible to exactly compensate for filter gain variations with FET switches Q5–Q7. The change in threshold then compensates for the slight change in gain of the receive filter which occurs when its center frequency is switched from the "answer" center frequency to the "originate" center frequency.

Specifically, for those embodiments which require additional compensation, the signal on lead 201 is provided to the inverting input of comparator U9. The positive input of comparator U9 is fixed at a predetermined voltage produced by dividing a positive reference voltage source by the divider consisting of resistors R56 and R57. Resistors R56 and R57 are chosen so that comparator U9 produces a "low" signal when switch S1B is in the "originate" position (and lead 201 has a "high" signal thereon) and a "high" signal when switch S1B is in the "answer" position (and lead 201 has a "low" signal thereon). A "low" signal at the output of comparator U9 causes resistors R50 and R59 to be connected in parallel. Therefore, the voltage provided to the positive input of comparator U8 is determined by the voltage divider consisting of resistor R60 and resistors R50 and R59 are parallel. On the other hand, when the switch S1B is in the "answer" position, comparator U9 provides a "high" signal on its output, which effectively places resistors R60 and R50 in parallel. The threshold voltage divider therefore consists of resistors R60 and R50 in parallel and resistor R59.

Device U8 is connected with feedback resistor R40 so that when the signal present in its negative input exceeds the variable threshold voltage applied to its positive input, its output becomes negative. The negative voltage at the output of device U8 is applied to the resistive voltage divider consisting of resistors R44 and R63. The reduced signal at the junction of resistors R44 and R63 is, in turn, connected to the base of transistor Q8. A negative signal turns "off" transistor Q8 to "release" the output of the limiter circuit, U5, and allow signals produced by the circuit to pass to the rest of the circuitry. If, on the other hand, the signal present at the negative input of device U8 is less than the threshold voltage, its output becomes positive, which positive voltage is applied via the resistive voltage divider to the base of transistor Q8. Transistor Q8, thereupon, turns "on", grounding the output of the limiter circuitry to effectively "mute" the apparatus.

Specifically, when no signal is present at the output of the receive filter, the active rectifier U9 produces substantially no voltage at its output. The absence of voltage at the negative output device U8 causes it to produce a high output, in turn, turning "on" transistor Q8 and muting the limiter circuitry. On the other hand, when a valid input signal is present at the output of the receive filter, the signal is rectified by active rectifier device U9, filtered by capacitor C30 and the resulting D.C. signal causes device U8 to produce a low signal on its output which, in turn, turns "off" transistor Q8 allowing the signals to pass to the remaining circuitry.

The output of device U8 is also provided to the computer (after being converted to RS232 levels by device U12) on pin J2-1 to inform the computer when incoming signals are being processed by the modem.

When it is not muted, the output of the limiter circuitry is provided from the output of device U5 to input pin 1 of I.C. chip U15. In accordance with principles well-known to those skilled in the art, chip U15 converts FSK-coded tones into digital logic levels for transmission to the associated computer apparatus. Digital signals are produced by I.C. chip U15 on output pin 7 and are provided to the upper input of RS232 driver U13. This driver device has its lower input coupled by resistor R65 to a positive voltage source and converts the logic levels produced by chip U15 into RS232 voltage levels (plus or minus 12 volts) which are slew-rate limited by capacitor C28 and provided to the computer via pin J2-2.

Alternatively, the modem may interface with the associated computer via a "cassette port" which accepts digital signals coded in tone bursts. In order to operate with this type of an interface, switch S2 is moved to the "cassette" or "B" position. The output of chip U15, on pin 7, is also provided to comparator U11. Comparator U11 is provided with resistors R47–R49 and R58 and is connected to act as an invertor for the output data from chip U15.

The output of device U11 is connected to the upper input of NAND gate U14. The lower input of NAND gate U14 is connected to the output of limiter circuit U5. Therefore, in response to the signals at its inputs, U14 generates tone bursts which have the frequency of the output signal from limiter U5 and are controlled by the output signal level on pin 7 of IC chip U15. In particular, when the output of chip U15 is "high", comparator U11 provides a "low" output to gate U14 which disables the gate and causes it to apply a "high" output, via resistor R51, switch S2A and pin J2-2 to the computer. When the output of IC chip U15 is "low", comparator U11 applies a "high" signal to gate U14 which enables the gate to pass the tone signals generated by limiter U5 to the computer, via resistor R51, switch S2A and pin J2-2.

Data to be transmitted over the telephone line from the computer is provided to the modem via pin J1-2. The signal at pin J1-2 is normally held "high" by resistor R43 and receives RS232 signals (plus or minus 12 volts) from the computer. The RS232 signals pass, via diode CR9 and resistor R54, to receiver amplifier U10. Resistors R54 and R55 provide a voltage divider to divide the incoming signal level down to a level suitable for amplifier U10.

Amplifier U10 is provided with resistors R52 and R53 as a threshold circuit to compare the input signal, via resistor R54, to a threshold established on its positive terminal. The threshold can be varied by means of switch S2B; when switch S2B is in the "RS232" position, resistors R61 and R62 establish a threshold of approximately 3 volts on the positive terminal of amplifier U10. The incoming RS232 signals (at plus or minus 12 volts) are then compared to the threshold in order to convert the RS232 signals into the logic levels used by chip U15. When switch S2B is in the "cassette" position, however, diode CR10 shunts resistor R62 to establish a 0.6 volt threshold level which is used as a comparison level for the audio frequency tone signals which are provided to the receiver amplifier U10, via resistor R54, from the computer. The output of amplifier U10 (which normally ranges from 0 to 5 volts) is provided to the incoming port of I.C. chip U15 at pin 11.

In response to an incoming signal at pin 11, I.C. chip U15 produces FSK-coded tones on its output pin 9. The tones consist of digitally-synthesized sine waves, as shown in line A of FIG. 3. The signal at pin 9 is provided, via capacitor C1, to variable resistor R1 which is used as a transmit level control. From there the signal is provided, via resistor R8, to the transmit filter consisting of amplifier device U6, capacitor C8 and resistors R27, R9 and R7. The transmit filter removes harmonics from the digital sine wave generated by I.C. chip U15 in order to prevent "singing" or feedback between the transmit and receive filters through transformer T1.

The center frequency of the transmit filter is also controlled by transistor Q1, which, when operated, places resistor R7 in parallel with resistor R9. Transistor Q1 is, in turn, controlled by resistor R6 and switch S1C. When switch S1C is in the "originate" position the base of transistor Q1 is grounded via switch S1C, causing transistor Q1 to be turned "off". Thus, the outgoing signal is divided by the voltage divider consisting of resistors R8 and R7. When, however, switch S1C is in the "answer" position, the base of transistor Q1 is connected to a positive voltage source. Transistor Q1 turns "on" connecting resistor R7 in parallel with resistor R9. Therefore, the outgoing signal is divided by the voltage divider consisting of resistor R8 and resistor R7 in parallel with resistor R9. The signal produced at the output of the transmit filter is shown in line B of FIG. 3. It consists of a sine wave with the higher harmonics removed and is provided via resistor R28 to transformer T1 and to the telephone line.

The following values are suitable for one illustrative embodiment of the invention. The invention, however, is not limited by these values and other suitable values may be used by those skilled in the art to produce the same result:

| CAPACITORS | | | |
|---|---|---|---|
| Device | Value | Device | Value |
| C1 | 0.1 mF | C18 | 0.0047 mF |
| C7 | 0.0047 mF | C19 | 0.0047 mF |
| C8 | 0.0047 mF | C20 | 0.0047 mF |
| C11 | 0.0047 mF | C23 | 1.0 mF |
| C12 | 0.0047 mF | C28 | 330 pF |
| C16 | 0.047 mF | C30 | 3.3 mF |
| C17 | 0.0047 mF | C31 | 68 pF |

| DIODES | |
|---|---|
| Device | Code |
| CR1 | 1N4735 |
| CR2 | 1N4002 |
| CR3 | 1N4002 |
| CR4 | 1N4735 |
| CR5 | 1N4148 |
| CR10 | 1N4148 |

| INTEGRATED CIRCUITS | |
|---|---|
| Device | Code |
| U1 | MC4558, Wideband Op Amp |
| U2 | MC4558, Wideband Op Amp |
| U3 | MC4558, Wideband Op Amp |
| U4 | MC4558, Wideband Op Amp |
| U5 | MLM311P1, Comparator |
| U6 | MC4558, Wideband Op Amp |
| U7 | MC4558, Wideband Op Amp |
| U8 | LM339, Quad Comparator |
| U9 | LM339, QUAD Comparator |
| U10 | LM339, QUAD Comparator |
| U11 | LM339, QUAD Comparator |
| U12 | 75488, RS-232 Driver |
| U13 | 75488, RS-232 Driver |
| U14 | 75488, RS-232 Driver |
| U15 | MC14412AFP, CMOS, MODEM |

| RESISTORS | | | |
|---|---|---|---|
| Device | Value | Device | Value |
| R1 | 10K | R33 | 1.0K |
| R2 | 620 ohms | R34 | 1.0K |
| R3 | 180 ohms | R35 | 1 M |
| R6 | 9.1K | R36 | 1.0K |
| R7 | 2.26K | R37 | 910 ohms |
| R8 | 8.06K | R38 | 107K |
| R9 | 13.7K | R39 | 422K |
| R10 | 100K | R40 | 590 ohms |
| R11 | 10K | R41 | 118K |
| R12 | 32.4K | R42 | 4.7K |
| R13 | 287K | R43 | 16K |
| R14 | 360K | R44 | 4.7K |
| R15 | 10K | R45 | 2K |
| R16 | 39K | R46 | 2.4 M |
| R17 | 4.7K | R47 | 2.4 M |
| R18 | 1.3K | R48 | 1.0K |
| R19 | 52.3K | R49 | 9.1K |
| R20 | 1.18K | R50 | 1.1K |
| R21 | 2.74K | R51 | 820 ohms |
| R22 | 73.2K | R52 | 10K |
| R23 | 1.65K | R53 | 390K |
| R24 | 15 M | R54 | 1.0K |
| R25 | 27K | R55 | 10K |
| R26 | 620 ohms | R56 | 9.1K |
| R27 | 165K | R58 | 9.1K |
| R28 | 620 ohms | R59 | 820 ohms |
| R29 | 4.7K | R60 | 9.1K |
| R30 | 806 ohms | R61 | 30K |
| R31 | 33.2K | R62 | 11K |
| R32 | 806 ohms | R63 | 1.1K |

| -continued | |
|---|---|
| R65 | 1.0K |

Although one illustrative embodiment has been described herein other modificatons and changes within the spirit and scope of this invention will be apparent to those skilled in the art.

What is claimed is:

1. An electronic bandpass filter comprising, filter circuitry, said circuitry having at least one filter stage having a signal path therethrough, and gain means comprising amplifier means having a signal path therethrough, said amplifier signal path being connected electrically in series with the signal path in said filter stage and said amplifier means having a signal gain greater than the signal gain of said filter circuitry so that more than half of the signal gain of said filter results from said gain means.

2. An electronic bandpass filter in accordance with claim 1 wherein said filter circuitry and said gain means each have a voltage signal gain and the magnitude of the voltage signal gain of said gain means is at least ten times the magnitude of the voltage signal gain of said filter circuitry.

3. An electronic bandpass filter in accordance with claim 1 wherein said filter has an input and said gain means is connected in series with said input and said filter stage.

4. An electronic bandpass filter in accordance with claim 1 wherein said filter has an output and said gain means is connected in series with said filter stage and said output.

5. An electronic bandpass filter in accordance with claim 1 wherein said filter circuitry has a plurality of filter stages.

6. An electronic bandpass filter in accordance with claim 1 wherein said filter circuitry comprises at least one single-pole filter stage.

7. An electronic bandpass filter in accordance with claim 6 wherein said filter circuitry is a multi-pole filter.

8. An electronic bandpass filter for use in a device which requires bandpass filtering with at least two distinct center frequencies and which generates a control signal to select one of said center frequencies, said filter comprising,
filter circuitry, said circuitry having at least one filter section having a signal path therethrough and being configurable to operate at one of two center frequencies,
means responsive to said control signal for selectively configuring said filter circuitry to operate at one of said two center frequencies, and
gain means comprising amplifier means having a signal path therethrough, said amplifier signal path being connected electrically in series with the signal path in said filter stage and said amplifier means having a signal gain greater than the signal gain of said filter circuitry so that more than half of the signal gain of said filter results from said gain means.

9. An electronic bandpass filter in accordance with claim 8 wherein said filter circuitry and said gain means each have a voltage signal gain and the magnitude of the voltage signal gain of said gain means is at least ten times the magnitude of the voltage signal gain of said filter circuitry.

10. An electronic bandpass filter in accordance with claim 9 wherein said filter circuitry comprises a plurality of filter sections.

11. An electronic bandpass filter in accordance with claim 8 wherein said filter has an input and said gain means is connected in series with said input and said filter circuitry.

12. An electronic bandpass filter in accordance with claim 8 wherein said filter has an output and said gain means is connected in series with said filter circuitry and said output.

13. An electronic bandpass filter for use in a device which requires bandpass filtering with at least two distinct center frequencies and which generates a control signal to select one of said center frequencies, said filter comprising, a multi-pole filter circuit, said circuit having a plurality of filter sections each of said sections having a signal path therethrough, said signal path being connected electrically in series with the signal paths of other filter stages and said filter sections being configurable to operate at one of two center frequencies, means responsive to said control signal for selectively configuring said filter sections to operate at one of said two center frequencies, and an operational amplifier having a signal path connected electrically in series with the signal paths of said filter sections and having a signal gain greater than the signal gain of said filter circuit so that more than half of the signal gain of said filter results form said gain means.

14. An electronic bandpass filter in accordance with claim 13 wherein said filter circuit and said amplifier each have a voltage signal gain and the magnitude of the voltage signal gain of said amplifier is at least ten times the magnitude of the voltage signal gain of said filter circuit.

15. An electronic bandpass filter in accordance with claim 13 wherein said filter has an input and said amplifier is connected in series with said input and said filter circuit.

16. An electronic bandpass filter in accordance with claim 13 wherein said filter has an output and said amplifier is connected in series with said filter circuit and said output.

* * * * *